United States Patent
Lu

(10) Patent No.: US 7,583,516 B2
(45) Date of Patent: Sep. 1, 2009

(54) PRINTED CIRCUIT BOARD ASSEMBLY WITH SHOCK ABSORBING STRUCTURE

(75) Inventor: Jiun-Nan Lu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/109,230

(22) Filed: Apr. 24, 2008

(65) Prior Publication Data
US 2009/0122505 A1 May 14, 2009

(51) Int. Cl.
*H05K 7/12* (2006.01)
(52) U.S. Cl. .................................. 361/809; 361/807
(58) Field of Classification Search ................ 361/818, 361/816, 742, 758, 770, 804, 807, 809
See application file for complete search history.

(56) References Cited

U.S. PATENT DOCUMENTS

| | | | | |
|---|---|---|---|---|
| 5,535,092 A | * | 7/1996 | Bang | 361/685 |
| 5,956,835 A | * | 9/1999 | Aksu | 29/468 |
| 6,252,768 B1 | * | 6/2001 | Lin | 361/687 |
| 6,275,374 B1 | * | 8/2001 | Shin et al. | 361/680 |
| 6,462,954 B1 | * | 10/2002 | Kuo et al. | 361/752 |
| 7,028,389 B2 | | 4/2006 | Chang | |
| 7,359,210 B2 | * | 4/2008 | Summers et al. | 361/758 |
| 7,471,509 B1 | * | 12/2008 | Oliver | 361/685 |
| 2006/0019510 A1 | * | 1/2006 | Rudduck et al. | 439/74 |
| 2007/0085250 A1 | * | 4/2007 | Chang | 267/141.3 |

* cited by examiner

*Primary Examiner*—Dean A. Reichad
*Assistant Examiner*—Dameon E Levi
(74) *Attorney, Agent, or Firm*—Andrew C. Cheng

(57) ABSTRACT

An exemplary printed circuit board assembly includes a printed circuit board, four supporting members, four shock-absorption members, and four fixing members. The printed circuit board defines a plurality of cutouts therein. Each supporting member defines a positioning hole therein. The shock-absorption members are snapped in the cutouts, and each has a first surface contacting the corresponding supporting member, a second surface parallel to the first surface, and a through hole extending through the first and second surfaces. The first and second surfaces are disposed at opposite sides of the printed circuit board. Each fixing member comprises a first portion pressed on the second surface of the corresponding shock-absorption member, and a second portion extending through the through hole and engaging in the positioning hole.

12 Claims, 3 Drawing Sheets

PRINTED CIRCUIT BOARD ASSEMBLY WITH SHOCK ABSORBING STRUCTURE

BACKGROUND

1. Technical Field

The present invention relates to a printed circuit board assembly with shock-absorbing structure.

2. Description of Related Art

Printed circuit boards (PCBs) are in widespread use nowadays. Generally, a PCB is positioned to supporting members protruded from somewhere, such as a computer enclosure. Through holes are defined in the PCB as extensions of screws or bolts to secure the printed circuit board. However, the PCB is rigidly connected to the supporting members and cannot withstand forces of impact transmitted via the supporting members and the screws, especially for a PCB of ball grid array (BGA) type.

What is needed, therefore, is a PCB assembly with shock absorbing structure.

SUMMARY

In accordance with a present embodiment, a printed circuit board assembly includes a printed circuit board, four supporting members, four shock-absorption members, and four fixing members. The printed circuit board defines a plurality of cutouts therein. Each supporting member defines a positioning hole therein. The shock-absorption members are snapped in the cutouts, and each has a first surface contacting the corresponding supporting member, a second surface parallel to the first surface, and a through hole extending through the first and second surfaces. The first and second surfaces are disposed at opposite sides of the printed circuit board. Each fixing member comprises a first portion pressed on the second surface of the corresponding shock-absorption member, and a second portion extending through the through hole and engaging in the positioning hole.

Other advantages and novel features will be drawn from the following detailed description of at least one preferred embodiment, when considered in conjunction with the attached drawings.

BRIEF DESCRIPTION OF THE DRAWINGS

Many aspects of the present printed circuit board assembly can be better understood with reference to the following drawings. The components in the drawings are not necessarily drawn to scale, the emphasis instead being placed upon clearly illustrating the principles of the present printed circuit board assembly. Moreover, in the drawings, like reference numerals designate corresponding parts throughout the several views.

DETAILED DESCRIPTION OF THE EMBODIMENTS

Embodiments of the present printed circuit board assembly will now be described in detail below and with reference to the drawings.

Figure 1:
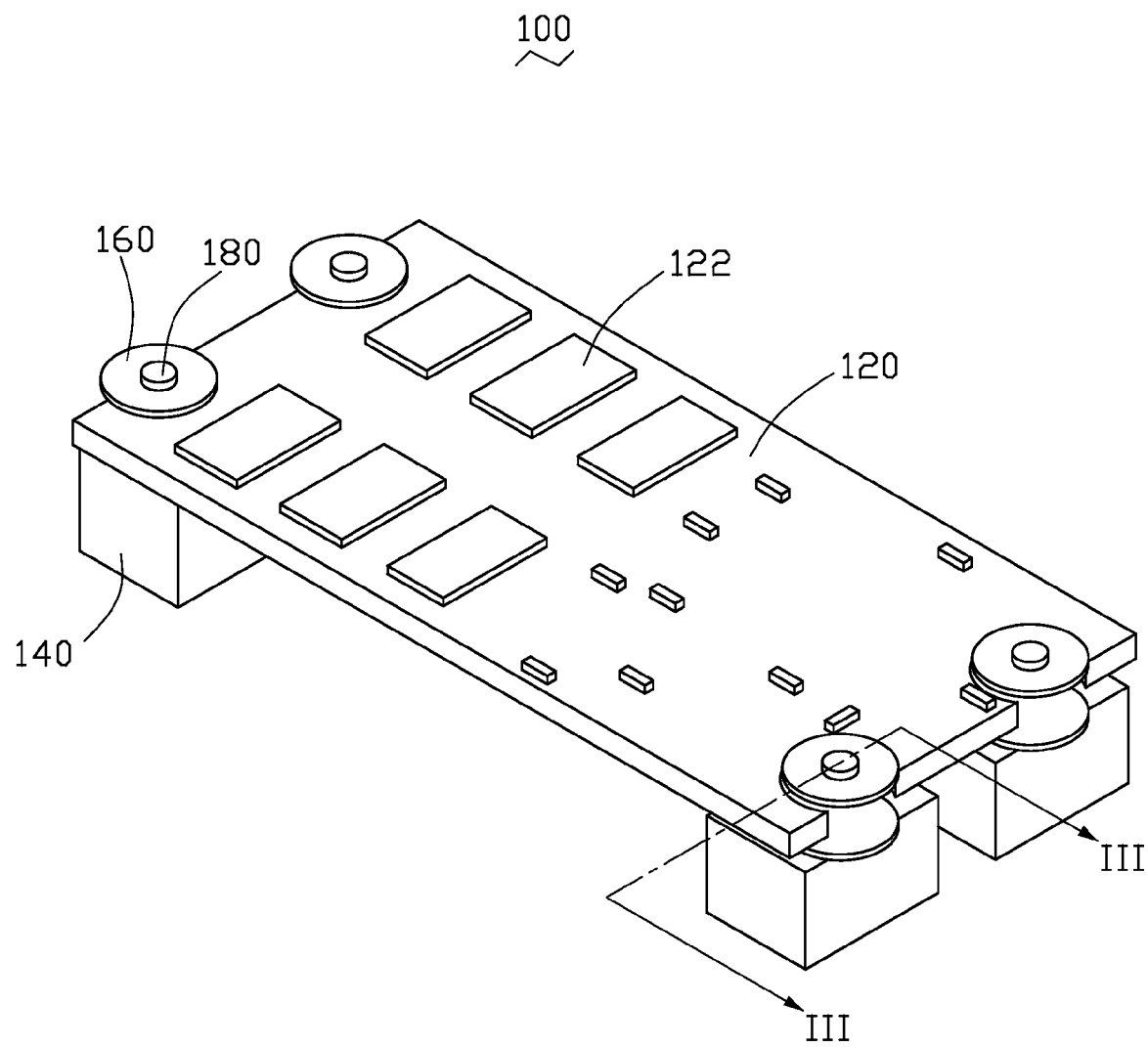
FIG. 1 is an isometric, schematic view of a printed circuit board assembly, according to an exemplary embodiment.
Figure 2:
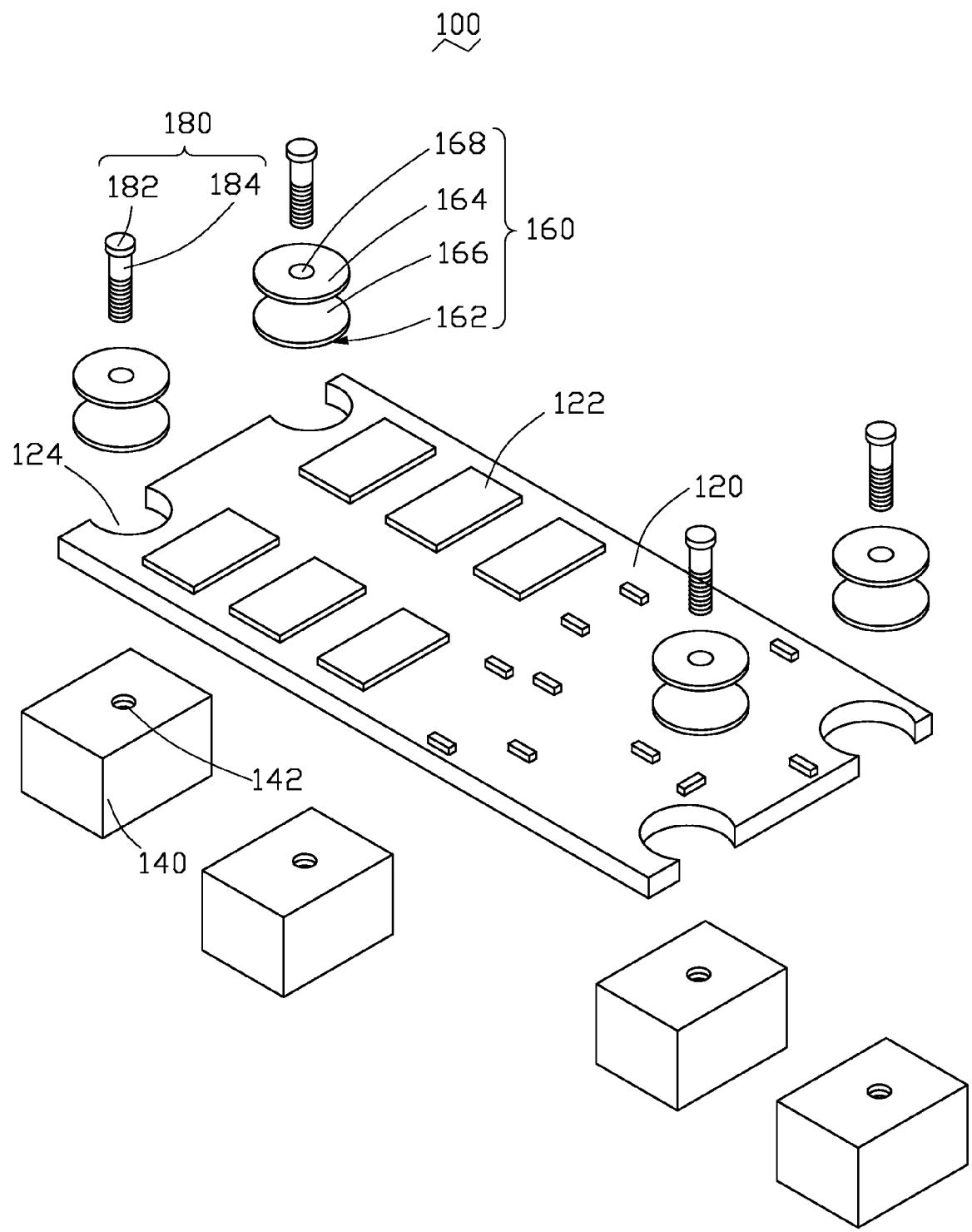
FIG. 2 is an exploded view of the printed circuit board assembly of FIG. 1.

Referring to FIGS. 1-2, a printed circuit board (PCB) assembly 100 in accordance with an exemplary embodiment is illustrated. The PCB assembly 100 comprises a PCB 120, a shock-absorption structure including four supporting members 140, four shock-absorption members 160, and four fixing members 180.

The PCB 120 can be a ball grid array (BGA) type PCB, along with any other types as well. The PCB 120 is mounted with a plurality of electronic components 122 on a side thereof, and defines four C-shaped cutouts 124 respectively at two opposite edges thereof.

Each supporting member 140 is a cubic block defining a positioning hole 142 such as a screw hole in the embodiment, in an upper portion thereof. The supporting members 140 are located at an opposite side of the PCB 120.

The shock-absorption members 160 in the embodiment are made of elastic material, such as plastic, rubber etc, and each comprise a first surface 162 contacting the corresponding supporting member 140, a second surface 164 parallel to the first surface 162, and a concave portion 166 between the first and second surfaces 162, 164. Each shock-absorption member 160 defines a central through hole 168 extending through the first and second surfaces 162, 164. The concaved portion 166 is configured to be a half-elliptical column, a parabolic column, or other column-like structure. The concave portion 166 comprises a smooth outer surface 167 between the first and second surfaces 162, 164.

The fixing members 180 each have a first portion 182 pressing the corresponding shock-absorption member 160 to the corresponding supporting member 140, and a second portion 184 extending through the through hole 168 and engaging in the positioning hole 142 to position the corresponding shock-absorption member 160 onto the fixing member 180. The fixing members 180 can be screws, bolts, or the like. In the embodiment, the fixing members 180 are screws, each comprising a head and a threaded post extending from the head.

Figure 3:
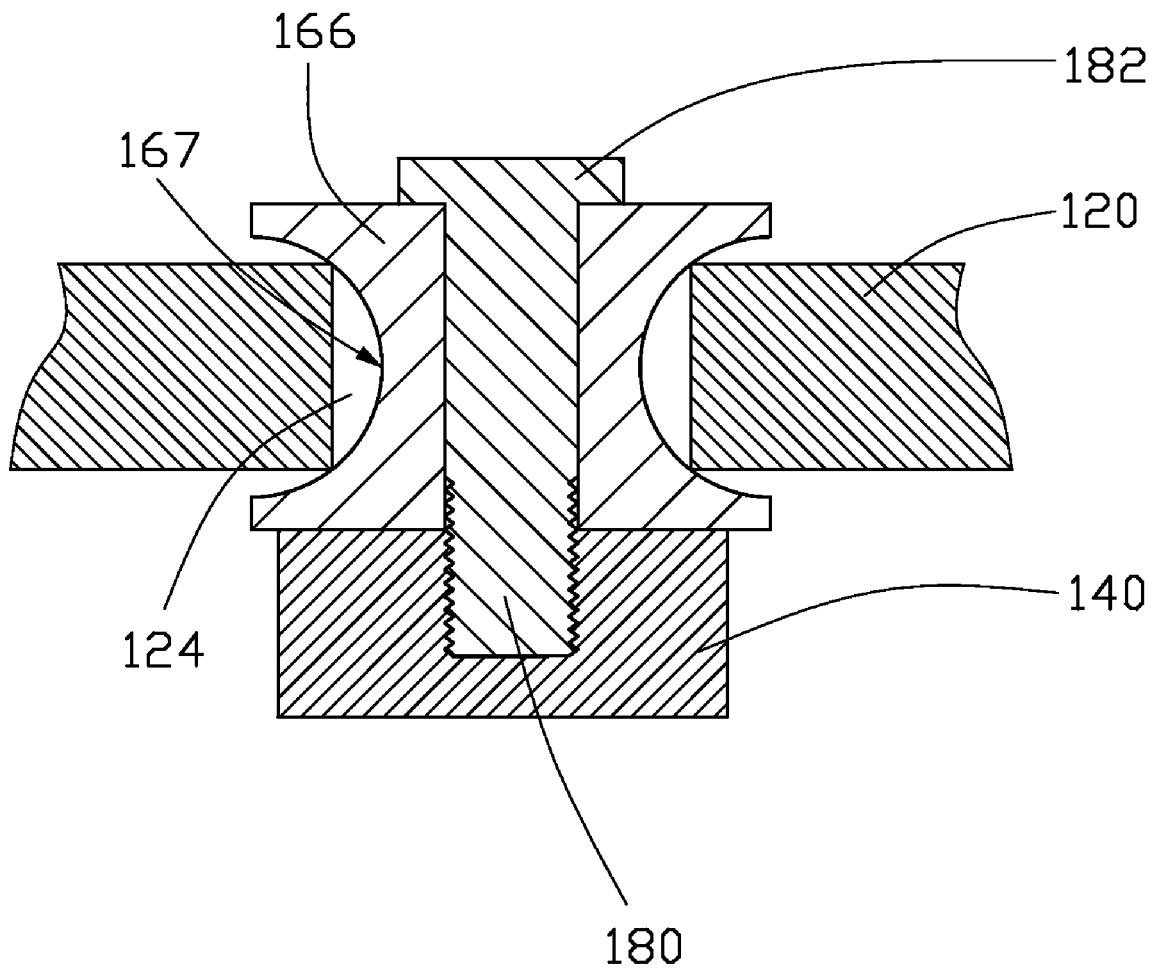
FIG. 3 is a cross-sectional view of a portion of the printed circuit board, taken along III-III line of FIG. 1.

Referring also to FIG. 3, in assembly, the PCB 120 snaps the concaved portions 166 of the shock-absorption members 160 in the cutouts 124, respectively. The second portions 184 are extended though the though holes 168 of the shock-absorption members 160 and then screwed into the screw holes 142 of the supporting members 140 respectively, until each first portion 182 abuts the second surface 164 of the corresponding shock-absorption member 160, and presses the corresponding shock-absorption member 160 onto the corresponding supporting member 140. As a result, the shock-absorption members 160 are secured to the supporting members 140, and cooperatively position the PCB 120 at a level between the first and second surfaces 162, 164.

In the embodiment, the shock-absorption members 160 are made of elastic material, and separate the PCB 120 from the supporting members 140 and the positioning members 180. Thus, forces of impact transmitted toward the PCB 120 via the supporting members 140 and the positioning members 180 are partially absorbed by the shock-absorption members 160 and thus diminished before reaching the PCB 120. Therefore, a risk of damages to the PCB 120 and the electronic components 122 on the PCB 120 decreases and even eliminates.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. A printed circuit board assembly comprising:
   a printed circuit board defining a plurality of cutouts therein;
   a plurality of supporting members each defining a positioning hole therein;
   a plurality of shock-absorption members snapped in the cutouts respectively, each shock-absorption member having a first surface contacting the corresponding supporting member, a second surface parallel to the first surface, and a concaved portion between the first and second surfaces, and defining a through hole extending through the first and second surfaces, the first and second surfaces being disposed at opposite sides of the printed circuit board; the concaved portion being selected from the group consisting of a half-elliptical column and a parabolic column; and
   a plurality of fixing members each comprising a first portion pressed on the second surface of the corresponding shock-absorption member, and a second portion extending through the through hole and engaging in the positioning hole.

2. The printed circuit board assembly as claimed in claim 1, wherein the concaved portion comprises a smooth outer surface between the first and second surfaces.

3. The printed circuit board assembly as claimed in claim 1, wherein the cutouts are defined at opposite edges of the printed circuit board.

4. The printed circuit board assembly as claimed in claim 3, wherein the cutouts are C-shaped.

5. The printed circuit board assembly as claimed in claim 1, wherein the shock-absorption members are made of elastic material.

6. The printed circuit board assembly as claimed in claim 1, wherein the supporting members are cubic blocks.

7. A shock-absorption structure installed on a printed circuit board defining a plurality of cutouts therein, the shock-absorption structure comprising:
   a plurality of supporting members, a positioning hole being formed on each supporting member;
   a plurality of shock-absorption members snapped in the plurality of cutouts respectively, each shock-absorption member comprising:
   a first surface contacting the corresponding supporting member; and
   a second surface parallel to the first surface, and
   a concaved portion between the first and second surfaces, defining:
   a through hole being extending through the first surface and the second surface, and the first surface and the second surface being disposed at opposite sides of the printed circuit board; and
   a plurality of fixing members each comprising a first portion pressed on the second surface of the corresponding shock-absorption member, and a second portion extending through the through hole and engaging in the positioning hole,
   wherein the concaved portion being selected from the group consisting of a half-elliptical column and a parabolic column.

8. The shock-absorption structure as claimed in claim 7, wherein the concaved portion comprises a smooth outer surface between the first and second surfaces.

9. The shock-absorption structure as claimed in claim 7, wherein the cutouts are formed at opposite edges of the printed circuit board.

10. The shock-absorption structure as claimed in claim 9, wherein the cutouts are C-shaped.

11. The shock-absorption structure as claimed in claim 7, wherein the shock-absorption members are made of elastic material.

12. The shock-absorption structure as claimed in claim 7, wherein the supporting members are cubic blocks.

* * * * *